United States Patent
Sasaki et al.

(10) Patent No.: US 7,633,212 B2
(45) Date of Patent: Dec. 15, 2009

(54) DRIVING APPARATUS, ELECTRO-MECHANICAL CONVERSION ELEMENT USED THEREIN, PHOTOGRAPHIC APPARATUS AND MOBILE PHONE

(75) Inventors: Ryota Sasaki, Saitama (JP); Mitsuo Manabe, Saitama (JP)

(73) Assignee: Fujinon Corporation, Saitama-shi, Saitama (JP)

( * ) Notice: Subject to any disclaimer, the term of this patent is extended or adjusted under 35 U.S.C. 154(b) by 0 days.

(21) Appl. No.: 11/727,582

(22) Filed: Mar. 27, 2007

(65) Prior Publication Data
US 2007/0228882 A1 Oct. 4, 2007

(30) Foreign Application Priority Data
Mar. 28, 2006 (JP) .......................... P2006-087882

(51) Int. Cl.
*H01L 41/053* (2006.01)
*H02N 2/04* (2006.01)
(52) U.S. Cl. .................................... 310/328; 310/329
(58) Field of Classification Search ................. 310/328, 310/323.01–323.21, 329
See application file for complete search history.

(56) References Cited

U.S. PATENT DOCUMENTS

| 6,140,750 | A | * | 10/2000 | Ueyama | 310/369 |
| 6,545,389 | B1 | * | 4/2003 | Yoshida | 310/317 |
| 2003/0208892 | A1 | * | 11/2003 | Takeuchi et al. | 29/25.35 |
| 2005/0219774 | A1 | | 10/2005 | Yoshikawa et al. | |
| 2005/0248234 | A1 | * | 11/2005 | Hoshino | 310/328 |
| 2005/0258712 | A1 | * | 11/2005 | Hata et al. | 310/323.17 |
| 2006/0061233 | A1 | * | 3/2006 | Ito et al. | 310/317 |
| 2006/0238074 | A1 | * | 10/2006 | Manabe | 310/328 |

FOREIGN PATENT DOCUMENTS

CN 1678176 A 10/2005
JP 3141714 B2 12/2000

* cited by examiner

*Primary Examiner*—Walter Benson
*Assistant Examiner*—Derek J Rosenau
(74) *Attorney, Agent, or Firm*—Birch, Stewart, Kolasch & Birch, LLP

(57) ABSTRACT

A driving apparatus comprises: an electro-mechanical conversion element; a driving member, provided on one end side of the electro-mechanical conversion element, that moves in response to extension and contraction of the electro-mechanical conversion element; and a driven member frictionally engaged with the driving member, so as to cause the driven member to travel along the driving member, wherein the electro-mechanical conversion element and the driving member are connected to each other by an adhesive; and wherein a treatment for intensifying adhesive force is applied to an adhesive surface, which is to be attached to the adhesive, on at least one of the electro-mechanical conversion element and the driving member.

13 Claims, 10 Drawing Sheets

FIG. 8A

| | | | | EXAMPLE 1 | | | | |
|---|---|---|---|---|---|---|---|---|
| NO. | 1 | 2 | 3 | 4 | 5 | 6 | 7 | 8 |
| DROP HEIGHT | 1.6m | 1.6m | 1.6m | 1.6m | 1.6m | 1.6m | 1.7m | 1.7m |
| EVALUATION | ○ | ○ | ○ | ○ | ○ | ○ | ○ | ○ |
| NO. | 9 | 10 | 11 | 12 | 13 | 14 | 15 | 16 |
| DROP HEIGHT | 1.7m | 1.7m | 1.6m | 1.6m | 1.6m | 1.6m | 1.7m | 1.7m |
| EVALUATION | ○ | ○ | ○ | ○ | ○ | ○ | ○ | ○ |
| NO. | 17 | 18 | 19 | 20 | 21 | 22 | | |
| DROP HEIGHT | 1.7m | 1.8m | 1.8m | 1.8m | 1.8m | 1.8m | | |
| EVALUATION | ○ | ○ | ○ | ○ | ○ | ○ | | |

FIG. 8B

| | COMPARISON EXAMPLE 1 | | | | | |
|---|---|---|---|---|---|---|
| NO. | 1 | 2 | 3 | 4 | 5 | 6 |
| DROP HEIGHT | 1.6m | 1.6m | 1.6m | 1.6m | 1.6m | 1.6m |
| EVALUATION | × | × | ○ | × | × | × |

| NO. | 1 | 2 | 3 | 4 | 5 | 6 | 7 | 8 | 9 | 10 | 11 | 12 |
|---|---|---|---|---|---|---|---|---|---|---|---|---|
| EXAMPLE 2 | 710 | 690 | 720 | 670 | 630 | 760 | 600 | 620 | 750 | 690 | 680 | 650 |
| EXAMPLE 3 | 580 | 710 | 600 | 740 | 690 | 690 | 610 | 680 | 610 | 640 | 680 | 580 |
| COMPARISON EXAMPLE 2 | 160 | 290 | 250 | 250 | 310 | 320 | 250 | 290 | 320 | 240 | 250 | 350 |

| NO. | 13 | 14 | 15 | 16 | 17 | 18 | 19 | 20 | MEAN | MAXIMUM | MINIMUM |
|---|---|---|---|---|---|---|---|---|---|---|---|
| EXAMPLE 2 | 610 | 660 | 670 | 620 | 620 | 630 | 640 | 660 | 660 | 760 | 600 |
| EXAMPLE 3 | 760 | 570 | 570 | 570 | 720 | 600 | 530 | - | 640 | 760 | 530 |
| COMPARISON EXAMPLE 2 | 320 | 260 | 320 | 330 | 320 | 250 | 240 | - | 280 | 350 | 160 |

| ADHESIVE FORCE (gf) | V1 | V2 |
|---|---|---|
| 300 | 0.44 | 0.13 |
| 354 | 1.34 | 1.35 |
| 400 | 2.12 | 2.38 |
| 500 | 3.80 | 4.62 |
| 600 | 5.48 | 6.86 |

DRIVING APPARATUS, ELECTRO-MECHANICAL CONVERSION ELEMENT USED THEREIN, PHOTOGRAPHIC APPARATUS AND MOBILE PHONE

BACKGROUND OF THE INVENTION

1. Field of the Invention

The present invention relates to a driving apparatus, an electro-mechanical conversion element which is used in the driving apparatus, a photographic apparatus such as a small digital camera and a web camera in which an optical member is connected to the driving apparatus and a mobile phone having installed thereon the driving apparatus, the electro-mechanical conversion element or the photographic apparatus.

2. Description of the Related Art

The industry's attention is focused on a driving apparatus which utilizes an electro-mechanical conversion element as a driving apparatus for a lens of, for example, a digital camera or a mobile phone with a camera. As such a driving apparatus, there is known a driving apparatus in which a driving member is fixed to an one end of an electro-mechanical conversion element in a direction of extension and contraction thereof, the driving member is supported on a fixed member (a stationary member) in such a manner as to travel in an axial direction, and furthermore, the other end of the electro-mechanical conversion element in the extension and contraction direction thereof is fixed to the fixed member, whereby a drive voltage of a proper waveform is impressed to the electro-mechanical conversion element so as to cause the electro-mechanical conversion element to extract and contract, and a traveling member which is frictionally engaged with the driving member is caused to travel in the direction of extension and contraction of the electro-mechanical conversion element (refer to, for example, Japanese Patent No. 3141714).

In the driving apparatus, however, there was a problem that various connecting portions including a connecting portion between the electro-mechanical conversion element and the driving member easily fail in case an impact force is applied to the driving apparatus as a result of, for example, fall thereof.

SUMMARY OF THE INVENTION

The invention was made with a view to solving the problem, and an object thereof is to provide a driving apparatus which can prevent the failure of the connecting portions so as to secure a sufficient strength, an electro-mechanical conversion element to be used thereon, a photographic apparatus and a mobile phone.

With a view to attaining the object, according to the invention, there is provided a driving apparatus comprising: an electro-mechanical conversion element; a driving member, provided on one end side of the electro-mechanical conversion element, that moves in response to extension and contraction of the electro-mechanical conversion element; and a driven member frictionally engaged with the driving member, so as to cause the driven member to travel along the driving member, wherein the electro-mechanical conversion element and the driving member are connected to each other by an adhesive; and wherein a treatment for intensifying adhesive force is applied to an adhesive surface, which is to be attached to the adhesive, on at least one of the electro-mechanical conversion element and the driving member.

In this driving apparatus, the electro-mechanical conversion element and the driving member are connected to each other by the adhesive, and the treatment for intensifying adhesive force is applied to the adhesive surface produced by the adhesive on at least one of the electro-mechanical conversion element and the driving member. Consequently, even though an impact force is applied to the driving apparatus as a result of fall thereof, the failure of the connecting portion between the electro-mechanical conversion element and the driving member which is easy to fail can be prevented, so as to enable a sufficient strength to be secured. In addition, since the treatment for intensifying the adhesive force acting between the electro-mechanical conversion element and the driving member is applied in this way, the electro-mechanical conversion element and the driving member are strongly integrated with each other to be driven so as to increase the driving speed, that is, to increase the driving properties.

In addition, according to the invention, there is provided a driving apparatus comprising: an electro-mechanical conversion element; a driving member, provided on one end side of the electro-mechanical conversion element, that moves in response to extension and contraction of the electro-mechanical conversion element; a driven member frictionally engaged with the driving member; and a weight member provided on the other end side of the electro-mechanical conversion element, so as to cause the driven member to travel along the driving member, wherein the electro-mechanical conversion element and the weight member are connected to each other by an adhesive; and wherein a treatment for intensifying adhesive force is applied to an adhesive surface, which is to be attached to the adhesive, on at least one of the electro-mechanical conversion element and the weight member.

In this driving apparatus, since the electro-mechanical conversion element and the weight member are connected to each other by the adhesive and the treatment for intensifying adhesive force is applied to the adhesive surface produced by the adhesive on at least one of the electro-mechanical conversion element and the weight member, the failure of the connecting portion between the electro-mechanical conversion element and the weight member can be prevented, thereby making it possible to secure a sufficient strength. Furthermore, since the treatment for intensifying the adhesive force acting between the electro-mechanical conversion element and the weight member is applied in this way, the electro-mechanical conversion element and the weight member are strongly integrated with each other so as to increase the driving speed, that is, to increase the driving properties.

Here, the treatment for intensifying adhesive force is preferably implemented by a cleaning treatment or a mechanical treatment. Since, in many cases, the adhesive surface which is subjected to direct contact with air is in a different state from that in the interior of the adhesive due to oxidation or adhesion of dust thereto, there may occur a case where oxidative components and dust adhere to the adhesive surface. To cope with this, these oxidative components and dust can be removed to thereby intensify the adhesive force on the adhesive surface by applying a mechanical treatment which is a treatment of grinding the adhesive surface by use of an abrasive paper, abrasive cloth, sander, sand blasting and the like in the way described. Furthermore, since the adhesive surface is ground in this way, a substantial adhesive area on the adhesive surface can be increased so as to intensify the adhesive force further. In addition, by applying a cleaning treatment to the adhesive surface, the dirt and dust on the adhesive surface can be removed, so as to intensify the adhesive force on the adhesive surface.

Additionally, as the mechanical treatment, a sanding process is raised.

In addition, the sanding process is preferably implemented by use of an abrasive grain which is coarser than the grit of an 800-grit sand paper.

Furthermore, the adhesive surface produced by the adhesive on at least one of the electro-mechanical conversion element, the driving member and the weight member preferably has provided thereon at least an area whose surface roughness is Ra 1 µm or more. By adopting this configuration, the substantial adhesive area on the adhesive surface can be increased preferably, so as to intensify the adhesive force further.

In addition, the adhesive surface produced by the adhesive on at least one of the electro-mechanical conversion element, the driving member and the weight member preferably has provided thereon at least an area whose surface roughness is rougher than surface roughnesses of other surfaces than the adhesive surface. By adopting this configuration, the substantial adhesive area on the adhesive surface can be increased preferably, so as to intensify the adhesive force further.

Additionally, according to the invention, there is provided a method of producing an electro-mechanical conversion element, the method comprising, in this order: a stacking step of stacking a plurality of piezoelectric elements between electrodes so as to form a stacked type piezoelectric element; a surface roughening step of providing an area whose surface roughness is rougher on at least one end face of the stacked type piezoelectric element, said least one end face being along a direction in which the piezoelectric elements are stacked; and a cutting step of cutting the stacked type piezoelectric element to a predetermined dimension.

In a case where the electro-mechanical conversion element that is manufactured in this way is installed on the driving apparatus, the area whose surface roughness is coarse is provided on at least the one end face of the electro-mechanical conversion element to which the driving member or the weight member is connected by the adhesive in the stacking direction of the piezoelectric elements as the treatment of intensifying the adhesive force. Consequently, as this occurs, the substantial adhesive area between the electro-mechanical conversion element and the driving member or the weight member is increased to thereby intensify the adhesive force acting between the electro-mechanical conversion element and the driving member or the weight member, whereby even though an impact force is applied to the driving apparatus as a result of fall thereof, the failure of the connecting portion between the electro-mechanical conversion element and the driving member or the weight member can be prevented, so as to secure a sufficient strength. In addition, in this case, since the adhesive force is intensified as has been described above, the electro-mechanical conversion element and the driving member or the weight member are integrated with each other strongly so as to be driven, so as to increase the driving speed, that is, to enhance the driving properties.

Furthermore, since the surface roughening process in which the area whose surface roughness is coarse is provided on at least one end face of the stack of the piezoelectric elements in the stacking direction thereof as the treatment to intensify the adhesive force is implemented prior to the cutting process in which the piezoelectric elements are cut to the predetermined dimension, the coarse area can be provided on the relevant one end face at one time before cutting, thereby making it possible to facilitate the manufacture of the electro-mechanical conversion element.

In addition, a photographic apparatus according to the invention is made by connecting an optical member to the driven member of the driving apparatus. As this occurs, the optical member is not limited to a lens, and the driven member is used for a diaphragm, a shutter or an ND filter. In addition, this photographic apparatus can be made into a relatively small photographic apparatus such as a web camera and a digital camera.

Additionally, a mobile phone according to the invention comprises the driving apparatus, a driving apparatus including the electro-mechanical conversion element obtained by the producing method, or the photographic apparatus.

BRIEF DESCRIPTION OF THE DRAWINGS

FIG. 8 is a chart showing the results of a continuous drop test;

FIG. 9 is a chart showing the results of an adhesive force comparison test; and

FIG. 10 is a chart showing the results of an adhesive force—driving speed properties test.

DETAILED DESCRIPTION OF THE INVENTION

Figure 1:
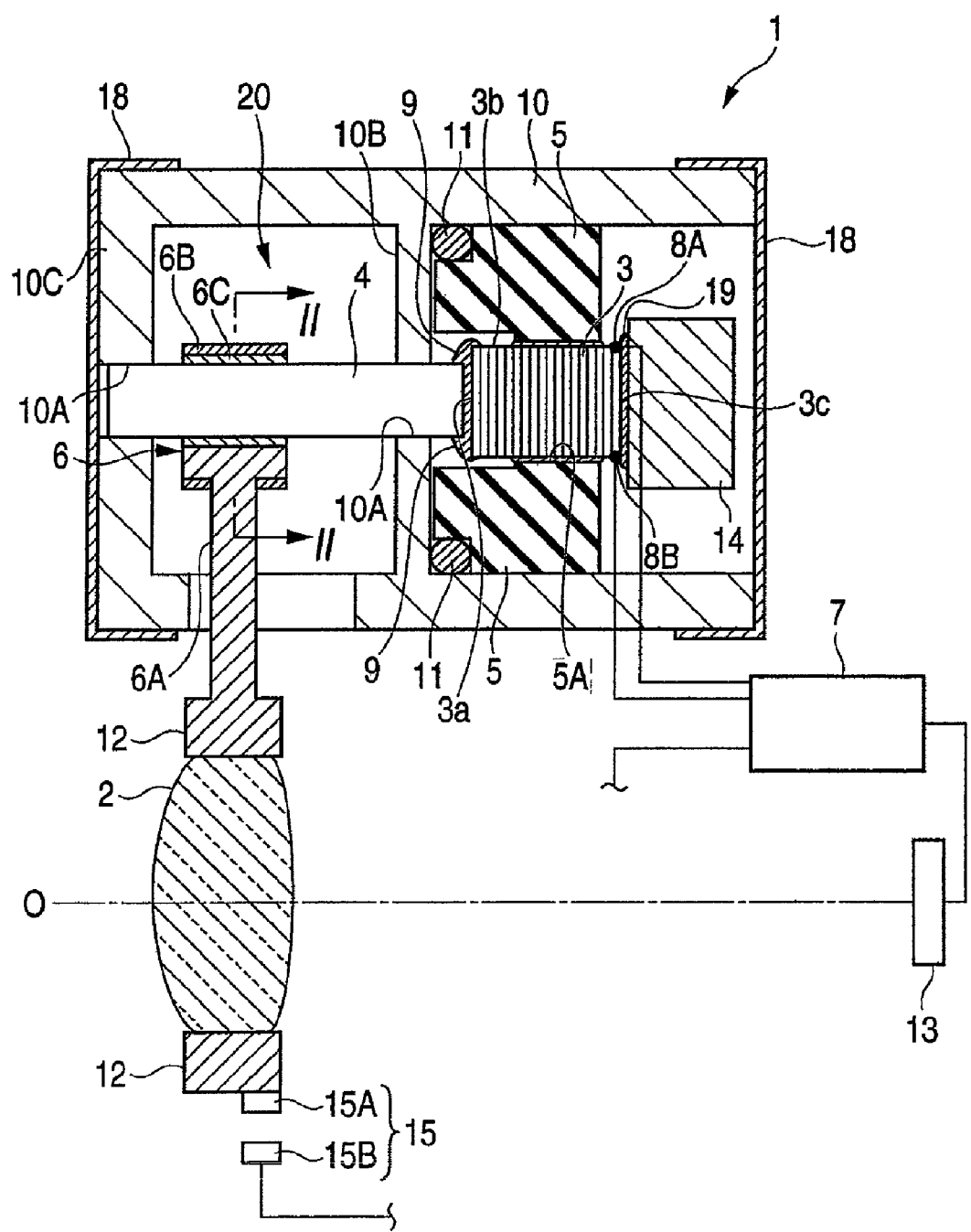
FIG. 1 is a sectional plan view which shows a driving apparatus according to a first embodiment of the invention.

Hereinafter, a preferred embodiment of a driving apparatus according to the invention will be described in detail by reference to the accompanying drawings. Note that in description of the drawings, like reference numerals are imparted to like elements, and the repetition of the same description will be omitted.

Firstly, a driving apparatus 1 according to a first embodiment of the invention will be described below.

FIG. 1 is a sectional view showing a first embodiment of the invention. As is shown in FIG. 1, the driving apparatus 1 according to the embodiment is such as to implement the drive of a movable lens 2 (an optical member) which acts as an object to be caused to travel and is made up of a main body 10, an actuator 20 having a piezoelectric element (an electro-mechanical conversion element) 3 and a driving member 4, a support member 5 for supporting the actuator 20, and a driven member 6. The piezoelectric element 3 is an electro-mechanical conversion element which can extend and contract when electric signals are inputted and is designed to extend and contract in a predetermined direction. This piezoelectric element 3 is connected to a control unit 7, so as to be caused to extend and contract when electric signals are inputted by the control unit 7. For example, two input terminals 8A, 8B are provided on the piezoelectric element 1. By repeatedly increasing and decreasing a voltage that is impressed to these input terminals 8A, 8B, the piezoelectric element 3 is caused to extend and contract repeatedly.

The driving member 4 is mounted on the piezoelectric element 3 in such a state that its longitudinal direction is oriented in a direction of extension and contraction of the piezoelectric element 3. To be specific, one end of the driving member 4 is brought into abutment with the piezoelectric element 3 and is then bonded thereto by use of an adhesive 9. Here, a surface roughness of a driving member 4 side surface of the piezoelectric element 3, that is, an adhesive surface 3a produced by the adhesive 9 is made rougher than surface roughnesses of other surfaces (here, side surfaces) of the piezoelectric element 3, and the adhesive surface 3a is cleaned with an alcohol based solvent, whereby the one end of the driving member 4 is bonded to the adhesive surface. This driving member 4 is an elongated member and for example, a circular pillar-like part is used therefor. A soft and highly rigid material is suitable as a material for the driving member 4, and beryllium is an ideal material which satisfies the condition. Beryllium has drawbacks, however, that it is expensive because it is a scarce metal and is difficult to work. Then, in this embodiment, a graphite composite material such as carbon graphite is used in which graphite crystals are combined strongly and rigidly. (Here, the graphite composite material means a composite material made up of a graphite which is a hexagonal plate-shaped crystalline form of carbon and a substance other than graphite, and carbon graphite means a substance which is made up of graphite and amorphous carbon. In addition, graphite is also called black lead or plumbago.) Since carbon graphite, which is a graphite composite material, has a property which is similar to beryllium (the specific gravity of beryllium is about 1.85, while the specific gravity of carbon graphite is about 1.8) and a property that it is relatively inexpensive and easy to work, compared to beryllium, the production cost of the actuator 20 can be decreased. Note that the shape of the driving member 4 is not limited to the circular pillar-like shape and hence may be formed into an angular pillar-like shape.

The driving member 4 is supported longitudinally movably by partitioning portions 10B, 10C which extend inwards from the main body 10. The partitioning members 10B, 10C are members for defining a traveling area of the driven member 6 and also function as support members for supporting the driving member 4.

A through hole 10A is formed in each of the partitioning portions 10B, 10C through which the driving member 4 is passed. The partitioning portion 10B supports the driving member 4 at a location in the vicinity of a portion where the driving member 4 is attached to the piezoelectric element 3, that is, a proximal end location of the driving member 4. The partitioning portion 10C supports a distal end location of the driving member 4. The main body 10 is such as to function as a frame element or a frame member for assemblage of the actuator 20. By being attached to the piezoelectric element 3, the driving member 4 reciprocates along the longitudinal direction thereof in response to extension and contraction of the piezoelectric element 3 which are performed repeatedly.

Note that while in FIG. 1, the case is described in which the driving member 4 is supported at the two proximal end side and distal end side locations by the partitioning portions 10B, 10C, there may occur a case where the driving member 4 is supported on either the proximal end side or the distal end side thereof. For example, by forming the through hole 10A in the partitioning portion 10B larger than the outside diameter of the driving member 4, the driving member 4 is supported at only the distal end location by the partitioning portion 10C. In addition, by forming the through hole 10A in the partitioning portion 10C larger than the outside diameter of the driving member 4, the driving member 4 is supported at only the proximal end location by the partitioning portion 10B. In addition, while in FIG. 1, the case is described in which the partitioning portions 10B, 10C which support the driving member 4 are formed integrally with the main body 10, these partitioning portions 10B, 10C may be made up of separate elements from the main body 10, so as to be mounted on the main body 10 afterwards. Even in the event that the partitioning portions are formed as separate elements, a similar function and advantage to those provided by the integrated partitioning portions can be obtained.

The driven member 6 is movably mounted on the driving member 4. This driven member 6 is mounted on the driving member 4 in such a state that the driven member 6 is frictionally engaged with the driving member 4 and is allowed to travel along the longitudinal direction of the driving member 4. For example, the driven member 6 is frictionally engaged with the driving member 4 with a predetermined friction coefficient and is mounted in such a state that the driven member 6 is pressed against the driving member 4 under a certain determined pressure, so that a certain determined frictional force is produced as it travels. When a traveling force which exceeds the frictional force is imparted to the driven member 6, the driven member 6 travels along the driving member 4. A lubricant is applied to a sliding contact portion between the driving member 4 and the driven member 6 to stabilize the operation thereof and increase the durability thereof when they are driven repeatedly. To be used for this lubrication, a lubrication is preferred which is difficult to change its performance with temperature so that the sliding drive resistance between the driving member 4 and the driven member 6 is not increased even at low temperatures. In addition, a lubricant of a type is preferred which does not produce dust which affects badly optical parts and constituent parts.

The actuator 20 is supported on the main body 10 by a support member 5. The support member 5 is such as to support the actuator 20 from a direction which intersects the direction of extension and contraction of the piezoelectric element 3 at right angles and is provided between the main body 10 which accommodates therein the actuator 20 and the piezoelectric element 3.

The support member 5 is formed of an elastic element having an elastic property which is equal to or larger than a predetermined level and is formed of, for example, a silicone resin. The support member 5 is made to have a through hole 5A which is provided so that the piezoelectric element 3 is passed therethrough and is assembled to the main body 10 in such a state that the piezoelectric element 3 is inserted thereinto. The support member 5 is secured to the main body 10 by virtue of bonding by use of an adhesive 11. In addition, the support member 5 is also secured to the piezoelectric element 3 by virtue of bonding by use of the adhesive. By making up the support member 5 of the elastic element, the support member 5 can support the actuator 20 in such a manner as to travel in the direction of extension and contraction of the piezoelectric element 3. In FIG. 1, although two support members 5 are illustrated to lie on both the sides of the piezoelectric element 3, respectively, these support members 5, 5 are so illustrated due to the annular support member 5 being shown in a sectional view which results by cutting it along a horizontal plane.

In addition, the support member 5 may be secured to the main body 10 and the piezoelectric element 3 by press fitting the support member 5 between the main body 10 and the piezoelectric element 3 so that the support member 5 is pressed against the main body 10 and the piezoelectric element 3, respectively. For example, a support member 5 is made up of an elastic element into a size or thickness which is larger than a space defined between the main body 10 and the piezoelectric element 3, and the support member 5 so made is press fitted into the space so as to be placed therein. As this occurs, the support member 5 is provided in such a manner as to be closely secured to the main body 10 and the piezoelectric element 3. As this occurs, the piezoelectric element 3 is pressed against by the support member 5 from both sides thereof in the direction which intersects the direction of extension and contraction of the piezoelectric element 3 at right angles, whereby the actuator 20 is supported.

In addition, while the support member 5 has been described as being formed of the silicone resin here, the support member 5 may be made up of a spring member. For example, a spring member may be interposed between the main body 10 and the piezoelectric element 3 so that the actuator 20 is supported relative to the main body 10 by this spring member.

The movable lens 2 is mounted on the driven member 6 via a lens frame 12. The movable lens 2 is such as to make up a photographic optical system of a camera and constitutes an object to be moved by the driving apparatus. This movable lens 2 is connected integrally with the driven member 6 and is provided in such a way as to move together with the driven member 6. A stationary lens and the like, not shown, are provided on an optical axis O of the movable lens 2, so as to make up the photographic optical system of the camera. In addition, a photographic device 13 is provided on the optical axis O. The photographic device 13 is a photographic unit for converting an image formed by the photographic optical system into an electric signal and is made up of, for example, a CCD. The photographic device 13 is connected to the control unit 7 and outputs an image signal to the control unit 7.

A weight member 14 is attached to an adhesive surface 3c at an end portion of the piezoelectric element 3 by an adhesive 19. The weight member 14 is a member for transmitting extension and contraction forces of the piezoelectric element 3 to the driving member 4 side and is attached to the end portion of the piezoelectric element 3 which is opposite to an end portion where the driving member 4 is mounted. A part which is heavier than the driving member 4 is used as the weight member 14, whereby the extension and contraction of the piezoelectric element 3 can be transmitted to the driving member 4 with good efficiency. For example, when the driving member 4 is 8 mg and the piezoelectric element 3 is 30 mg, a weight member 14 of 20 mg is used.

The weight member 14 is formed of a soft material. A material whose Young's modulus is smaller than those of the piezoelectric element 3 and the driving member 4 is used as a material for the weight member 14. As the Young's modulus of the weight member 14, 1 GPa or less is preferable, and 300 MPa or less is more preferable. By using such a material, a resonant frequency in the actuator 20 can be made small sufficiently relative to a driving frequency for the piezoelectric element 3, thereby making it possible to reduce the effect of resonance.

The weight member 14 like this is formed by mixing resin with metallic powder, and a metallic power used should, of course, be a substance having a function as a weight (a function to make its mass heavy). In addition to this, the metallic powder is preferably a substance which is difficult to be oxidized (difficult to rust). As a substance which is difficult to be oxidized, for example, gold, platinum, copper, SUS, silver, aluminum and the like are known, and these metals may be used for the metallic powder. However, these metals are expensive, and in particular, gold, platinum and silver, which are precious metals, are expensive. In addition, since copper and SUS have large specific weights, these metals are suitable for use as a weight but they are not metals which are never be oxidized. Consequently, in this embodiment, tungsten is used as the metallic powder and olefin-based elastomer resin is used as the resin. To be specific, 90 or more wt % of tungsten and an olefin-based elastomer resin which occupies the remaining portion of the material are mixed together. In this way, the mixing of the metallic powder into the weight member 14 can increase the weight thereof, and the utilization of the elastically deformable material can dampen unnecessary resonance at the time the piezoelectric element 3 is put into operation.

In order to reduce the size of the driving apparatus, the specific gravity of the weight member 14 is preferably as high as possible and is set substantially to range, for example, from 8 to 12, and the weight member 14 of this embodiment has a Young's modulus of the order of 60 MPa and a specific gravity of the order of 11.7. When attempting to design a weight member 14 which has as small a volume as possible, although a weight member 14 is optimum which has a combination of a large specific gravity and a small Young's modulus, a weight member 14 can be used which has a specific gravity (1.8 or larger) larger than that of the driving member 4 and a Young's modulus of 1 GPa or less. Namely, a member is suitable for the weight member 14 in which a numerical value resulting by dividing its specific gravity by its Young's modulus (specific gravity/Young's modulus) is equal to or larger than $1.8 \times 10^{-9}$.

In addition, the weight member 14 is provided in such a state that the member is not supported or fixed relative to the main body 10. Namely, the weight member 14 is provided in such a state that the weight member 14 is neither directly supported or fixed relative to the main body 10 nor is supported or fixed relative to the main body 10 via an adhesive or resin material in such a manner that its movement is restrained. A metallic mounting fixture 18 which is formed into a U-shape by bending a metallic plate is fixedly fitted on each of front and rear ends (left and right ends as viewed in the figure) of the main body 10. The metallic mounting fixture 18 is fixedly fitted on the main body 10 at bent portions produced at both ends thereof.

A detector 15 is provided on the driving apparatus 1 for detecting a traveling position of the driven member 6. As the detector 15, for example, an optical detector is used, and a photoreflector, photointerrupter or the like is used. To be specific, in a case where a device including a reflector 15A and a detecting unit 15B is used as the detector 15, the reflector 15A is attached to the lens frame 12 which is formed integrally with the driven member 6, whereby a detection light is emitted from the detecting unit 15B to the reflector 15A side, and a reflection light which is reflected by the reflector 15A side is then detected by the detecting unit 15B so as to detect the traveling position of the driven member 6 and the movable lens 2.

The detector 15 is connected to the control unit 7. An output signal of the detector 15 is inputted into the control unit 7. The control unit 7 is such as to control the whole of the driving apparatus, and is made up of, for example, a CPU, a ROM, a RAM, an input signal circuit, an output signal circuit and the like. In addition, the control unit 7 includes a driving circuit for activating the piezoelectric element 3 for operation and outputs an electric signal to the piezoelectric element 1 to drive the element.

Figure 2:
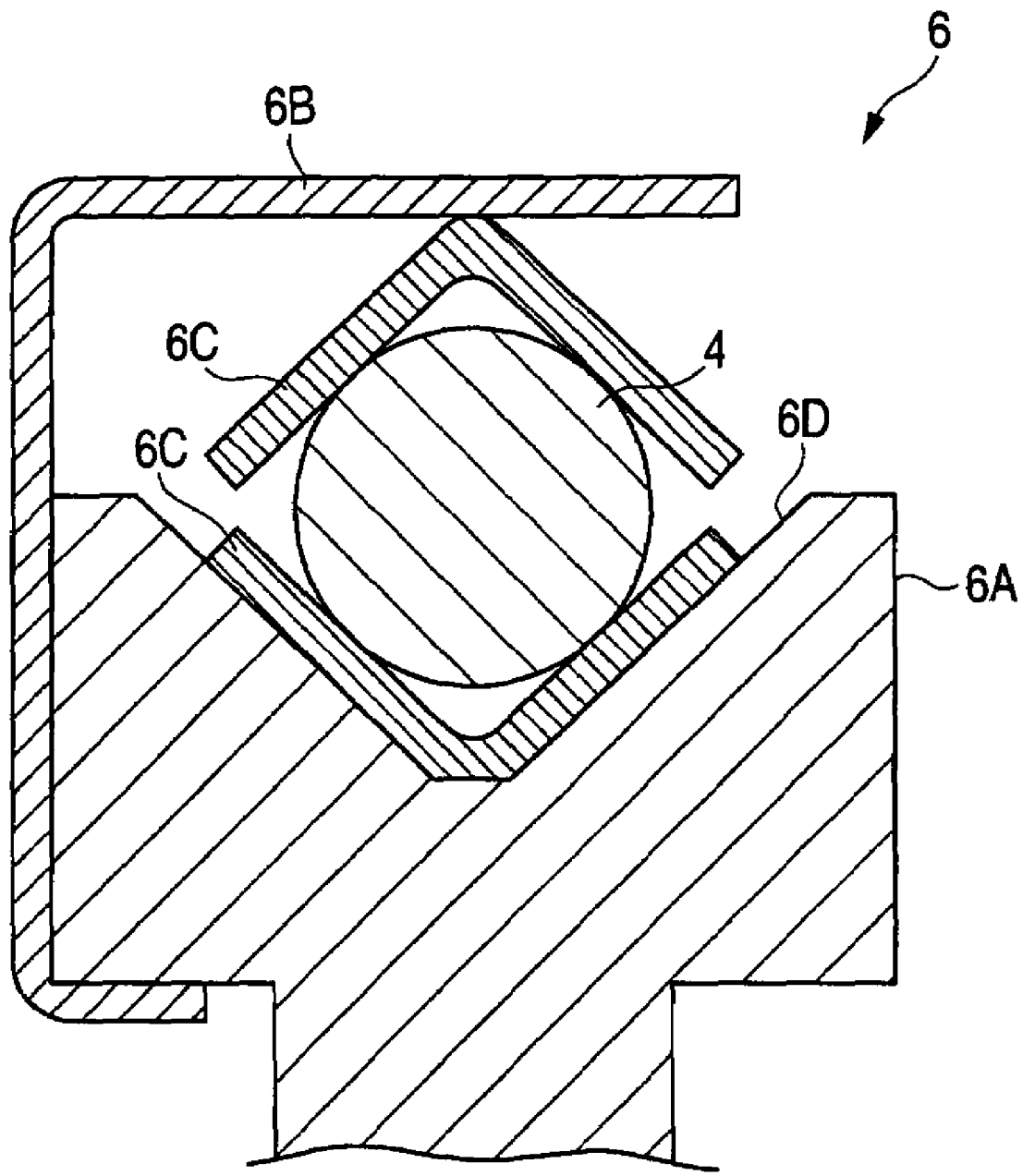
FIG. 2 is a sectional view taken along the line II-II in FIG. 1.

FIG. 2 is a sectional view of the driven member 6 which is taken along the line II-II in FIG. 1. As is shown in FIG. 2, the driven member 6 is made up of a main body portion 6A, a pressing portion 6B and sliding portions 6C. The main body portion 6A is pressed against the driving member 4 by the pressing portion 6B under a certain determined force. A V-shaped groove 6D is formed in the main body portion 6A. The driving member 4 is accommodated within this groove 6D in such a state that the driving member 4 is held by the two sliding portions 6C therebetween. The sliding portions 6C, 6C are each a plate element having a V-shaped cross section and are disposed in such a manner as to face each other on respective recessed portion sides so as to hold the driving member 4 therebetween. By accommodating the driving member 4 within the V-shaped groove 6D in this way, the driven member 6 can be attached to the driving member 4 in a stable fashion.

For example, a leaf spring material having an L-shaped cross section is used as the pressing portion 6B. One side of the pressing portion 6B is hooked on the main body portion 6A, while the other side thereof is disposed in a position which faces the groove 6D, whereby the driving member 4 which is accommodated within the groove 6D can be held therein by the other side of the pressing portion 6B together with the main body portion 6A and the sliding portions 6. By adopting this configuration, the main body portion 6A can be pressed against the driving member 4 side.

The driven member 6 is mounted in such a state that the main body portion 6A is pressed against the driving member 4 side under the certain determined force by the pressing portion 6B in this way, whereby the driven member 6 is brought into frictional engagement with the driving member 4. Namely, the driven shaft 6 is mounted in such a state that the main body portion 6A and the pressing portion 6B are pressed against the driving member 4 under the certain determined pressure, so as to produce a certain determined friction force as the driven member 6 moves.

In addition, by holding the driving member 4 by the sliding portions 6C, 6C which have the V-shaped cross sections, the driven member 6 is made to be brought into linear contact, or substantially in surface contact with the drive shaft 14 at four locations, whereby the driven member 6 can be brought into frictional engagement with the driving member 4 in a stable fashion.

Figure 3:
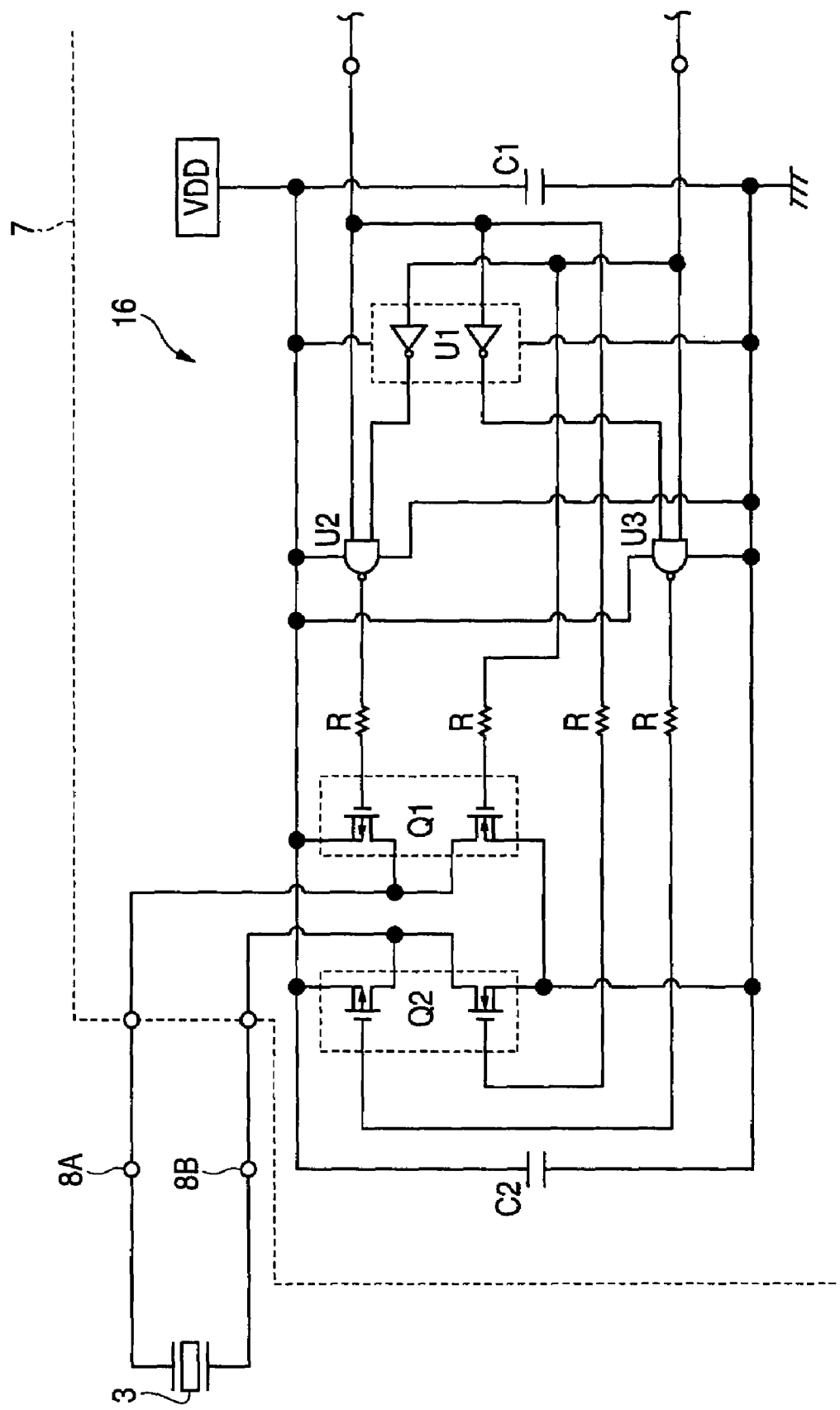
FIG. 3 is a circuit diagram which shows a driving circuit for an actuator shown in FIG. 1.

FIG. 3 is a circuit diagram of a driving circuit for operating the piezoelectric element 3. As is shown in FIG. 3, a driving circuit 16 is provided to be disposed within the control unit 7. This driving circuit 16 is such as to function as a drive circuit for the piezoelectric element 3 and to output a driving electric signal to the piezoelectric element 3. The driving circuit 16 receives a control signal which is inputted thereinto from a control signal generating unit (not shown) of the control unit 7 and outputs a driving electric signal for the piezoelectric element 1 by amplifying the control signal with respect to voltage or current. For example, a circuit in which an input stage is made up of logic circuits U1 to U3 and field-effect transistors (FET) Q1, Q2 are provided for use as an output state is used for the driving circuit 16. The transistors Q1, Q2 are designed to be able to output, as output signals, an H output (a high potential output), an L output (a low potential output) and an OFF output (an open output). The circuit diagram shown in FIG. 3 also consists of resistors R and capacitors C1 and C2.

Figure 4A:
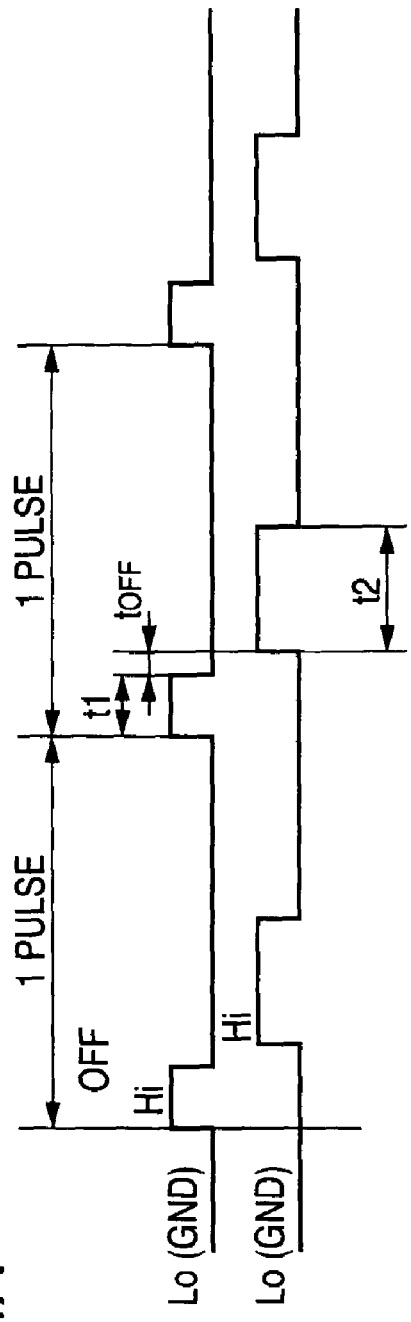
FIGS. 4A and 4B are waveform diagrams of input signals which are inputted into the driving circuit in FIG. 3.
Figure 4B:
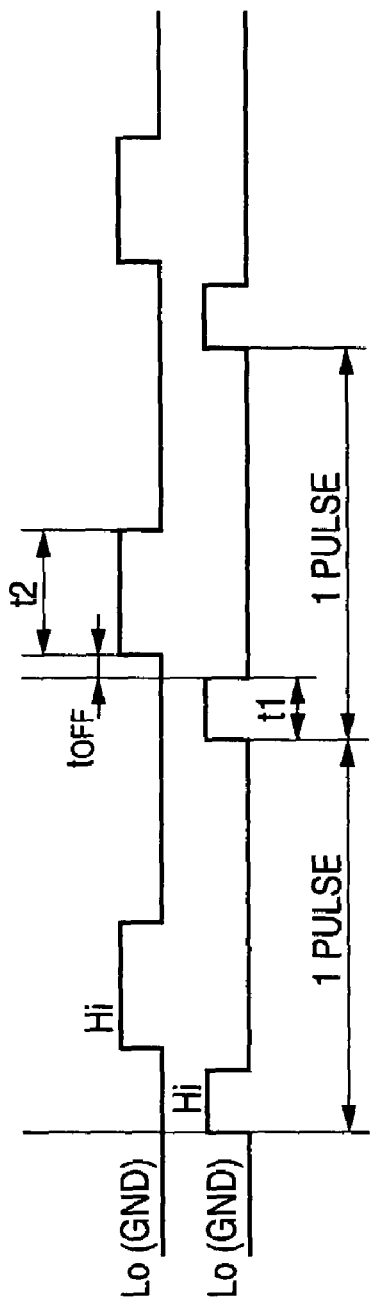
Figure 5A:
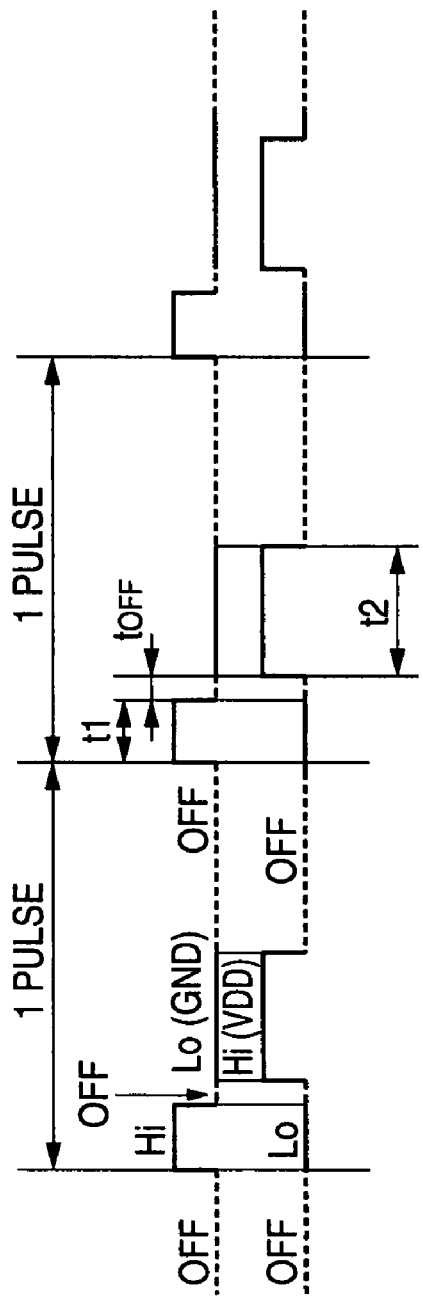
FIGS. 5A and 5B are waveform diagrams of output signals which are outputted from the driving circuit in FIG. 3.
Figure 5B:
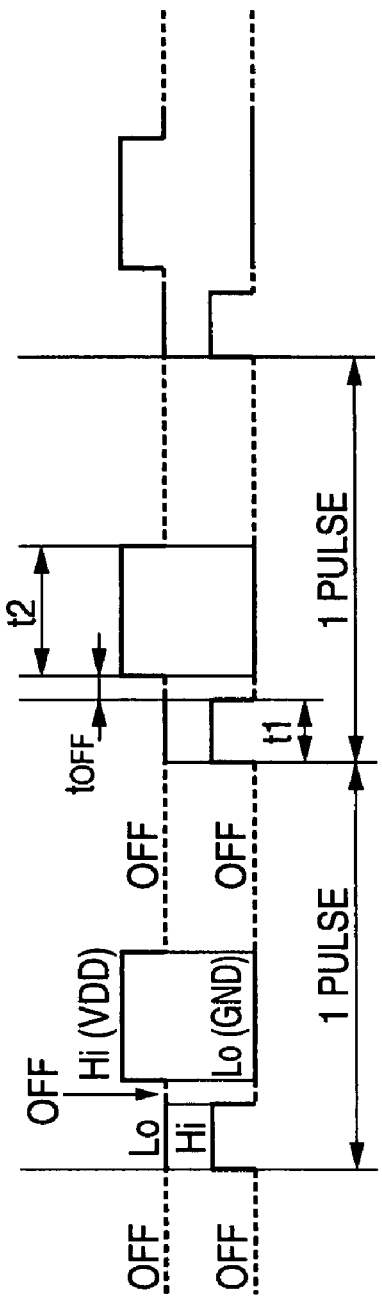

FIG. 4 shows input signals which are inputted into the driving circuit 16, and FIG. 5 shows output signals which are outputted from the driving circuit 16. FIG. 4(A) shows an input signal which is inputted when causing the driven member 6 to travel in the direction in which the driven member 6 approaches the piezoelectric element 3 (rightwards as seen in FIG. 1), and FIG. 4(B) shows an input signal which is inputted when causing the driven member 6 to travel in the direction in which the driven member 6 moves away from the piezoelectric element 3 (leftwards as seen in FIG. 1). In addition, FIG. 5A shows an output signal which is outputted when causing the driven member 6 to travel in the direction in which the driven member 6 approaches the piezoelectric element 3 (rightwards as seen in FIG. 1), and FIG. 5(B) shows an output signal which is outputted when causing the driven member 6 to travel in the direction in which the driven member 6 moves away from the piezoelectric element 3 (leftwards as seen in FIG. 1).

The output signals in FIGS. 5A and 5B are made to be pulse signals which are on and off at the same timing as the input signals shown in FIGS. 4A and 4B. The two signals in FIGS. 5A and 5B are inputted into the input terminals 8A, 8B of the piezoelectric element 3. Although signals made up of trapezoidal waveforms may be inputted into the input terminals 8A, 8B, the rectangular pulse signals shown in FIG. 5 can be inputted so as to activate the piezoelectric element 3. As this occurs, since the driving signal of the piezoelectric element 3 may take the form of the rectangular pulse signal, the signal generation is facilitated.

The output signals shown in FIGS. 5A and 5B are each made up of two rectangular pulse signals having the same frequency. These two pulse signals are made to be signals in which a potential difference between respective signals increases in a stepped fashion and decreases drastically or the potential difference increases drastically and decreases in a stepped fashion by causing their phases to differ from each other. By inputting the two signals, the extension speed and contraction speed of the piezoelectric element 3 can be caused to differ from each other, whereby the driven member 6 can be caused to travel.

For example, of the two signals shown in FIGS. 5A and 5B, it is set such that the other signal becomes H (high) after one signal becomes H (high) and is then decreased to L (low). In those signals, it is set such that when one signal becomes L, the other signal becomes H after a certain determined time lag $t_{OFF}$ has elapsed. In addition, in the event that the two signals are both L, the output state becomes an off state (an open state).

As the output signals or electric signals shown in FIGS. 5A and 5B which activate the piezoelectric element 3, a signal is used whose frequency exceeds the audible frequency. In FIGS. 5A and 5B, the frequencies of the two signals are made to be a signal whose frequency exceeds the audible frequency, and a signal whose frequency is in the range of, for example, 30 to 80 kHz is preferably used, and a signal whose frequency is in the range of 40 to 50 kHz is more preferably used. By using signals having these frequencies, the operation noise of the piezoelectric element 3 within the audible frequency area can be reduced. Furthermore, to select the electric signal with a view to avoiding the audible frequency area where the driving frequency is recognized as abnormal noise and in consideration of reduced consumed power, for example, a signal whose frequency is in the range of 20 to 200 kHz is preferably used, and a signal whose frequency is in the range of 50 to 100 kHz is more preferably used.

Incidentally, in the driving apparatus 1 of the embodiment, as has been described above, the surface roughness of the surface of the piezoelectric element 3 which lies on the driving member 4 side thereof or the adhesive surface 3a produced by the adhesive 9 is made rougher than the surface roughnesses of other surfaces (here, side surfaces) 3b of the piezoelectric element 3. To be specific, in the piezoelectric element 3, while the surface roughness of the side surfaces 3b is Ra (arithmetic mean roughness) 0.3 μm, the surface roughness of the adhesive surface 3a is made to be Ra 1 μm or more due to a sanding process, which is a mechanical treatment, being applied thereto. In other words, an area having the surface roughness of Ra 1 μm, which is larger than the surface roughness of the other surfaces 3b of the piezoelectric element 3 is provided on the adhesive surface 3a by the sanding process. Here, to be more preferable, the surface roughness of the adhesive surface 3a of the piezoelectric element 3 is made to be in the range of Ra 5 μm to Ra 6 μm.

This sanding process is applied by use of a sand paper whose grit number is, for example, 800-grit or more, and in this embodiment, to be more preferable, the sanding process is applied by use of a sand paper (an abrasive paper) whose grit number is 400-grit or more. Then, after the sanding process has been applied, the driving member 4 and the piezoelectric element 3 are bonded and connected together by the adhesive 9. Note that the sanding process means a process in which a surface is abraded by for example a sand paper so as to produce a desired surface roughness on the surface by polishing the surface or producing irregularities on the surface. Incidentally, the grit number of a sand paper is such as to indicate a classification of grits which are roughnesses (sizes) of abrasive grains on a sand paper, and the smaller the grit number of a sand paper gets, the coarser abrasive grains thereon become (namely, the grain size is increased), and the surface roughness of a surface to which the sanding process is applied becomes coarse.

Since the surface roughness of the adhesive surface 3a of the piezoelectric element 3 is made rough in this way, a substantial adhesive area between the piezoelectric element 3 and the driving member 4 is increased. Because of this, an adhesive force acting between the piezoelectric element 3 and the driving member 4 is increased, that is, the adhesive force between the piezoelectric element 3 and the driving member 4 is intensified, whereby the piezoelectric element 3 and the driving member 4 are connected strongly and rigidly.

As has been described above, after the sanding process has bee applied, the adhesive surface 3 is cleaned by, for example, an alcohol solvent, and one end of the driving member 4 is bonded to the adhesive surface 3a by the adhesive 9. Namely, a cleaning treatment is applied to the adhesive surface 3a, and the one end of the driving member 4 is bonded to the adhesive surface 3a so cleaned. As a cleaning agent, various types of solvents of alcohol-based solvents which are represented by alcohol, and in addition to this, water such as pure water may be used. As a cleaning method, wiping, submersion and spraying are raised, and the cleaning is implemented by ultrasonic vibrations. By the cleaning like this, dirt and dust on the adhesive surface 3a can be removed to thereby intensify further the adhesive force between the piezoelectric element 3 and the driving member 4, whereby the piezoelectric element 3 and the driving member 4 are connected more strongly and rigidly.

Here, the driving member 4 is formed by cutting for example a longitudinally long material to be of a predetermined dimension. Consequently, when applying the sanding process to the adhesive 9 side surface of the driving member 4 or the adhesive surface produced by the adhesive 9 on the driving member 4, the sanding process needs to be applied to a cut surface which constitutes an adhesive surface every cutting. On the other hand, the piezoelectric element is formed by stacking for example piezoelectric elements and cutting or performing so-called dice cutting on a stack of piezoelectric elements so formed by stacking in the stacking direction of the piezoelectric elements to be of a predetermined dimension.

Consequently, in a case where the sanding process is applied to the adhesive surface 3a which constitutes at least one end face of the piezoelectric element 3 in the stacking direction of the piezoelectric elements as in the way used in the embodiment, the sanding process can be implemented after the piezoelectric element have been stacked and before the stacked piezoelectric elements are cut, in other words, the sanding process can be applied to the adhesive surface 3a at one time before dice cutting, thereby making it possible to ease the manufacture of the driving apparatus 1.

Next, the operation of the driving apparatus according to the embodiment will be described.

In FIG. 1, electric signals are inputted into the piezoelectric element 3, and the piezoelectric element 3 repeats its extension and contraction when the electric signals are so inputted. The driving member 4 reciprocates in response to the extension and contraction of the piezoelectric element 3. As this occurs, by causing the extension speed and contraction speed of the piezoelectric element 3 to differ from each other, a speed at which the driving member 4 moves to a certain determined direction and a speed at which the driving member 4 moves to an opposite direction are caused to differ from each other, whereby the driven member 6 and the movable lens 2 can be caused to move in desired directions.

As this occurs, since the adhesive force between the piezoelectric element 3 and the driving member 4 is intensified by making the surface roughness of the adhesive surface 3a of the piezoelectric element 3 rough and cleaning the adhesive surface 3a, the piezoelectric element 3 and the driving member 4 are driven while being connected together strongly and rigidly. Consequently, the driving member 4 can be driven at faster speeds and with faster response, thereby making it possible to increase remarkably the driving speed of the driven member 6 and the movable lens 2. As a result, a ratio at which an effect occupies in the driving speed is reduced in which even with the same electric signal inputted, the driving speed changes because the driving direction becomes vertical or horizontal depending upon the arrangement of the driving apparatus 1. In other words, the effect of speed change due to the difference in posture of the driving apparatus 1 is reduced.

In addition, while when the piezoelectric element 3 extends and contracts, vibrations are generated by the extension and contraction of the piezoelectric element 3, since the actuator 20 which includes the piezoelectric element 3 is supported by the support member 5 from the direction which intersects the direction of extension and contraction of the piezoelectric element 3 at right angles, the vibrations generated by the extension and contraction of the piezoelectric element 3 are difficult to be transmitted to the outside of the actuator 20. Because of this, the resonation of the actuator 20 with the outside member such as the main body 10 is suppressed, thereby making it possible to decrease the effect of resonation. Consequently, the driven member 6 and the movable lens 2 can be caused to travel accurately.

Furthermore, the resonant frequency of the actuator 20 itself is decreased by the weight member 14, and the deflection of the driving member 4 produced by virtue of resonation in other directions than the direction of extension and contraction of the piezoelectric element 3 is prevented, whereby since the driving force produced by virtue of extension and contraction of the piezoelectric element 3 is transmitted to the driven member 6 accurately and stably, the drive of the driven member 6 in the direction of extension and contraction of the piezoelectric element 3 can be controlled accurately and stably.

Thus, according to the driving apparatus 1 of the embodiment, the piezoelectric element 3 and the driving member 4 are connected together by the adhesive 9, and at least the area whose surface roughness is Ra 1 μm or more which is rougher than the surface roughness of the side surfaces 3b of the piezoelectric element 3 which are the other surfaces thereof than the adhesive surface 3a is provided on the adhesive surface 3a of the piezoelectric element 3 which is produced thereon by the adhesive 9. Because of this, the substantially adhesive area between the piezoelectric element 3 and the driving member 4 is increased so as to enable the adhesive force between the piezoelectric element 3 and the driving member 4 to be intensified. Consequently, even though an impact force is applied to the driving apparatus 1 as a result of the fall thereof or the like, the failure of the connecting portion between the piezoelectric element 3 and the driving member 4 can be prevented, thereby making it possible to secure the sufficient strength.

In addition, since, in the driving apparatus 1, the connecting portion between the piezoelectric element 3 and the driving member 4 is a part where stress is concentrated and hence which is easiest to fail, the aforesaid advantage of securing the sufficient strength by preventing the failure of the connecting portion is obtained remarkably here.

Furthermore, since the adhesive force acting between the piezoelectric element 3 and the driving member 4 is intensified, the piezoelectric element 3 and the driving member 4 are driven while being integrated with each other strongly and rigidly, so as to increase the driving speed of the driving apparatus 1, that is, the driving properties of the driving apparatus 1 can be enhanced.

While in the embodiment, the area having the rough surface roughness is provided on the adhesive surface 3a of the piezoelectric element 3 as has been described above, in addition to this, at least an area whose surface roughness is larger than the surface roughness of other surfaces than an adhesive surface of the driving member 4 which is produced thereon by the adhesive 9 may be provided on the adhesive surface, or only either of these areas whose surface roughnesses are rough may be provided. In addition, while the adhesive surface 3a of the piezoelectric element 3 is cleaned, in addition to this, the adhesive surface of the driving member 4 which is produced thereon by the adhesive 9 may be cleaned, or only either of these adhesive surfaces may be cleaned.

Incidentally, as the treatment to intensify the adhesive force on the adhesive surface, in addition to the mechanical treatment and the cleaning treatment which have been described above, a primer treatment in which a prefinishing coating agent is applied to the adhesive surface, a chemical treatment in which the adhesive surface is treated by use of an agent and a physical treatment in which ultraviolet rays radiation or the like is applied to the adhesive surface are raised.

The primer treatment is a treatment in which for example, a primer (a prefinishing coating agent) which is a low viscosity liquid with less non-volatile content is applied to the adhesive surface so as to intensify the adhesive force on the adhesive surface. The chemical treatment is a treatment in which a modification of the adhesive surface or a durable adhesion is realized by use of an agent. This chemical treatment includes a treatment in which the surface roughness is roughened by use of an agent. Note that as to the chemical treatment, JISK6848 describes a specific treatment method.

The physical treatment is a treatment in which the adhesive properties, wetting properties and adhesion of the adhesive surface are enhanced. As the physical treatment, an ultraviolet rays radiation treatment, a corona discharge treatment or a plasma treatment can be raised.

While in this embodiment, as the treatment for intensifying the adhesive force on the adhesive surface, the adhesive surface of the piezoelectric element is made rough by the application of the sanding treatment and the cleaning by use of the alcohol based solvent is implemented on the adhesive surface to remove dirt and dust therefrom before the bonding process, any of the treatments that have been raised above or a proper combination thereof may be used, and even in the event that such a treatment is adopted, a similar advantage to the advantage that has been described above can be provided. Note that as to the treatment for intensifying the adhesive force on the adhesive surface, the similar treatments are also possible in embodiments which will be described later on.

Next, a driving apparatus 30 according to a second embodiment of the invention will be described below.

Figure 6:
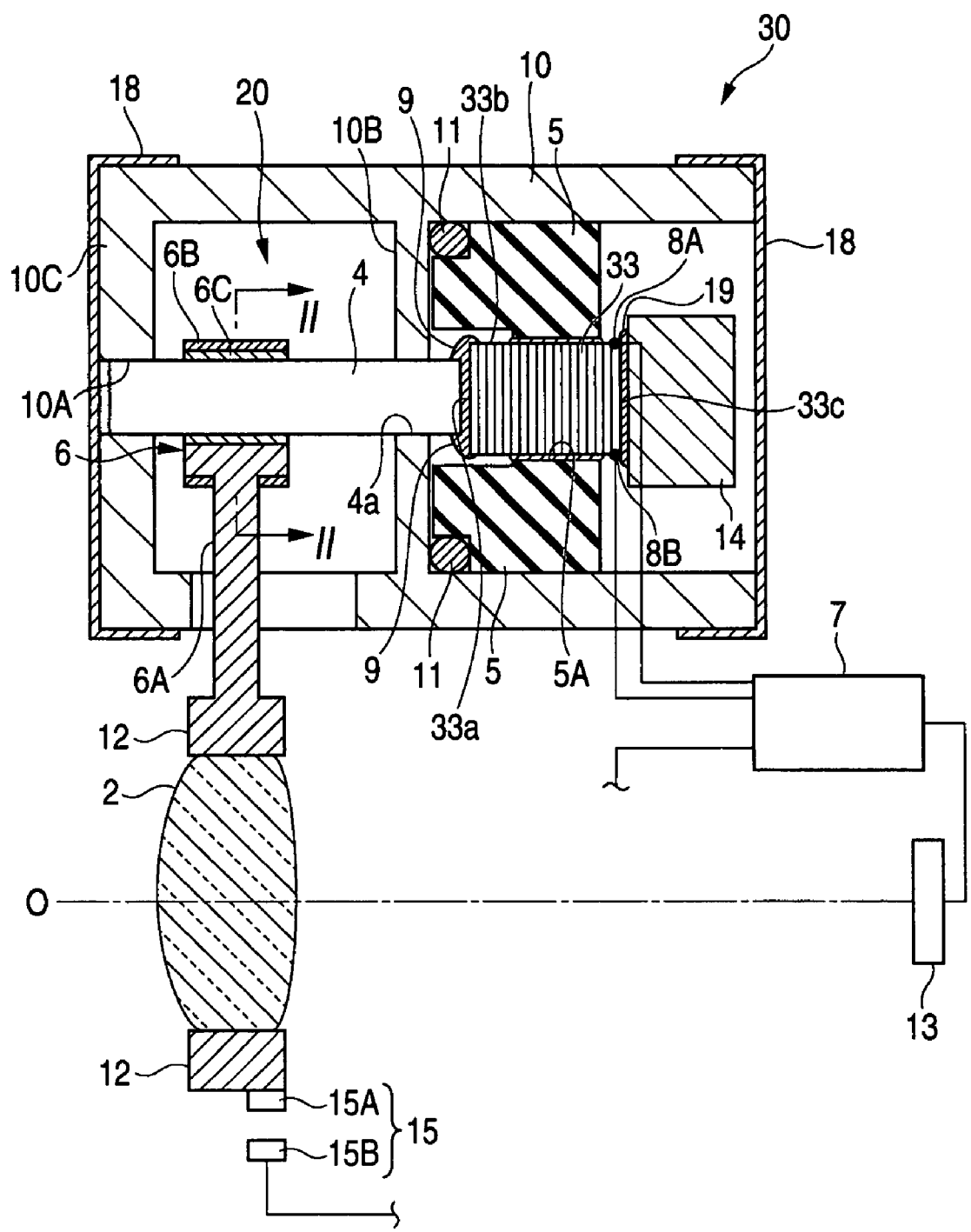
FIG. 6 is a sectional plan view of a driving apparatus according to a second embodiment of the invention.

FIG. 6 is a sectional view which shows a driving apparatus according to a second embodiment of the invention. The driving apparatus 30 of the second embodiment differs from the driving apparatus 1 of the first embodiment in that a piezoelectric element 33 shown in FIG. 6 is provided in place of the piezoelectric element 3 shown in FIG. 1.

In this piezoelectric element 33, the surface roughness of a surface 33c of the piezoelectric element 33 which lies to face a weight member 14, that is, the surface roughness of the adhesive surface 33c produced by an adhesive 19 is made rougher than the surface roughnesses of other surfaces (here, side surfaces) 33b of the piezoelectric element 33. To be specific, in the piezoelectric element 33, the surface roughness of the side surfaces 33b is Ra 0.3 μm, while the surface roughness of the adhesive surface 33c is made to be Ra 1 μm or more. In this embodiment, to be more preferable, a sanding process is applied by use of, for example, a 400-grit sand paper so as to obtain a surface roughness of Ra 5 μm to Ra 6 μm. In addition, after the sanding process has been applied, the adhesive surface 33a is cleaned by use of, for example, an alcohol based solvent, whereafter the weight member 14 and the piezoelectric element 33c are bonded and connected together by the adhesive 19.

Thus, in the driving apparatus 30, since the piezoelectric element 33 and the weight member 14 are connected together by the adhesive 19 and at least an area whose surface roughness is rougher than the surface roughness of the other surfaces (here, the side surfaces) 33b than the adhesive surface 33c is provided on the adhesive surface 33c of the piezoelectric element 33, a substantial adhesive area between the piezoelectric element 33 and the weight member 14 is increased, whereby an adhesive force acting between the piezoelectric element 33 and the weight member 14 is intensified. Consequently, the failure of the connecting portion between the piezoelectric element 33 and the weight member 14 can be prevented, and a similar advantage to the aforesaid advantage that a sufficient strength is secured can be obtained. Furthermore, since the adhesive force acting between the piezoelectric element 33 and the weight member 14 is enhanced, the piezoelectric element 33 and the weight member 14 are allowed to be driven integrally so as to increase the driving speed of the driving apparatus 30, that is, an advantage similar to the aforesaid advantage that the driving properties of the driving apparatus 30 are enhanced can be provided.

In addition, while in this embodiment, the area whose surface roughness is made rougher is provided on the adhesive surface 33c of the piezoelectric element 33 as has been described above, in addition to this, at least an area whose surface roughness is larger than the surface roughness of other surfaces than an adhesive surface of the weight member 14 which is produced thereon by the adhesive 19 may be provided on the adhesive surface, or only either of these areas whose surface roughnesses are rough may be provided. In addition, while the adhesive surface 33c of the piezoelectric element 33 is cleaned, in addition to this, an adhesive surface of the weight member 14 which is produced thereon by the adhesive 19 may be cleaned, or only either of these adhesive surfaces may be cleaned.

Next, a driving apparatus 40 according to a third embodiment of the invention will be described below.

Figure 7:
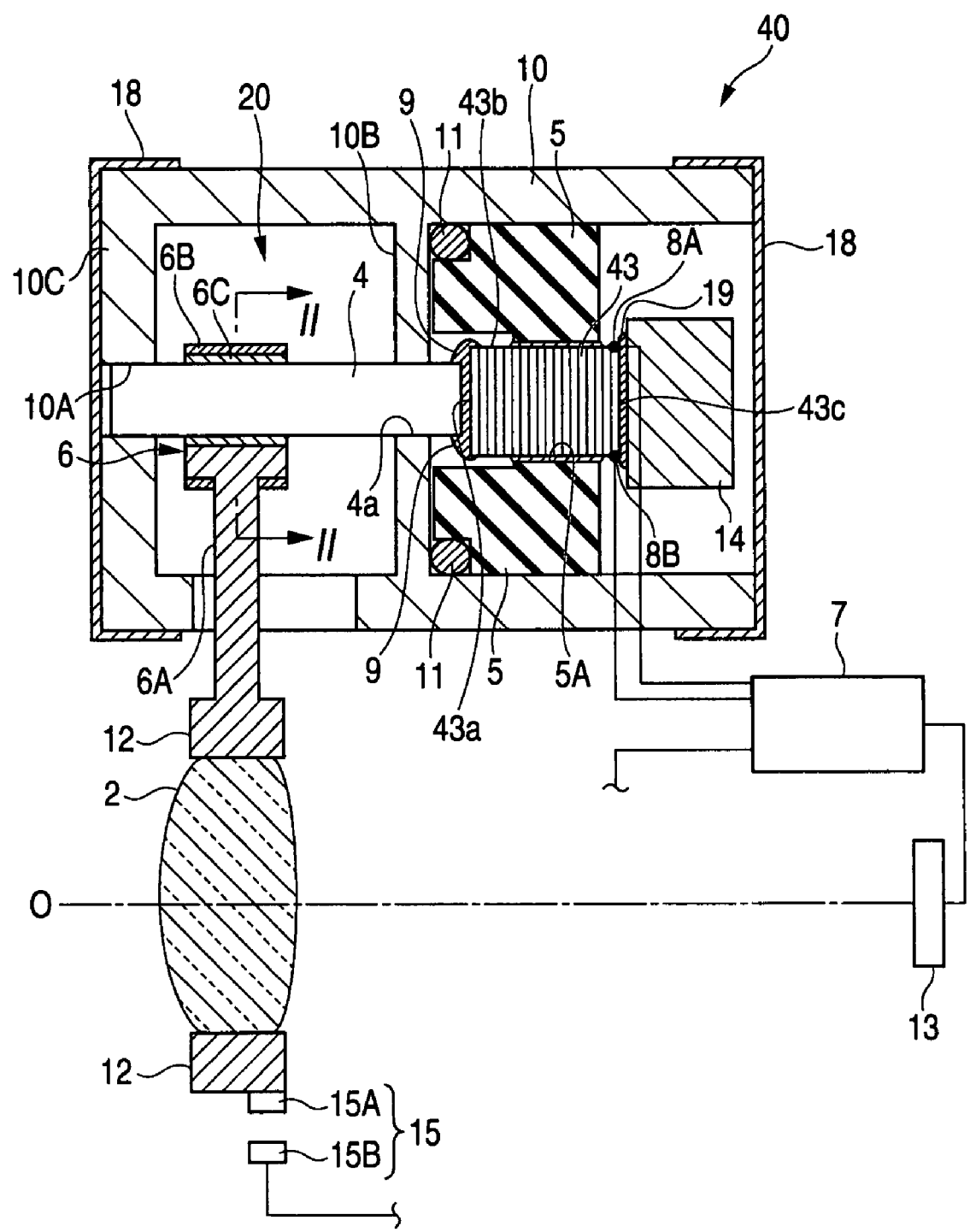
FIG. 7 is a sectional plan view of a driving apparatus according to a third embodiment of the invention.

FIG. 7 is a sectional view which shows a driving apparatus according to a third embodiment of the invention. The driving apparatus 40 of the third embodiment differs from the driving apparatus 1 of the first embodiment in that a piezoelectric element 43 shown in FIG. 7 is provided in place of the piezoelectric element 3 shown in FIG. 1. Also, the side surfaces 43b of the piezoelectric element 43 are shown in FIG. 7.

The piezoelectric element 43 is such as to be obtained by calcining, for example, a porous ceramic. This porous ceramic is a ceramic having an enormous number of fine holes or gaps and a large surface area. Consequently, the surface roughness of an exterior surface of the porous ceramic becomes substantially rough, and the surface roughness of an exterior surface of the piezoelectric element 43 becomes Ra 1 μm or more. Namely, in the piezoelectric element 43, the surface roughness of an adhesive surface 43a lying to face an adhesive 9 and the surface roughness of an adhesive surface 43c lying to face an adhesive 19 are made to be Ra 1 μm or more. In addition, the adhesive surfaces 43a, 43c are cleaned with an alcohol based solvent so as to remove dirt and dust from the adhesive surfaces 43a, 43c.

Thus, in the driving apparatus 40, the piezoelectric element 43 and a driving member 4 are connected together by the adhesive 9, and at least an area whose surface roughness is Ra 1 μm or more is provided on the adhesive surface 43a of the piezoelectric element 43, while the piezoelectric element 43 and a weight member 14 are connected together by the adhesive 19, and an area whose surface roughness is Ra 1 μm or more is provided on the adhesive surface 43c of the piezoelectric element 43. Because of this, substantial adhesive areas between the piezoelectric element 43 and the driving member 4 and the piezoelectric element 43 and the weight member 14 are increased, so as to enable an adhesive force acting between the piezoelectric element 43 and the driving member 4 and an adhesive force acting between the piezoelectric element 43 and the weight member 14 to be intensified.

In addition, since the adhesive surfaces 43a, 43c of the piezoelectric element 43 are cleaned with the alcohol based solvent before the piezoelectric element 43 is bonded to the driving member 4 and the weight member 14, respectively, so as to remove dirt and dust on the adhesive surfaces 43a, 43c, adhesive forces acting between the piezoelectric element 43 and the driving member 4 and the piezoelectric element 43 and the weight member 14 can be intensified further.

Consequently, even though an impact force is applied to the driving apparatus as a result of, for example, the fall thereof or the like, the failure of the connecting portion between the piezoelectric element 43 and the driving member 4 and the connecting portion between the piezoelectric element 43 and the weight member 14 can be prevented, thereby making it possible to secure a sufficient strength. Furthermore, since the adhesive forces at the connecting portions are intensified in the way described above, the piezoelectric element 43, the driving member 4 and the weight member 14 are driven while being integrated with each other strongly and rigidly, so as to increase the driving speed of the driving apparatus 40, that is, to enhance the driving properties of the driving apparatus 40.

Note that while in the embodiment, the adhesive surfaces 43a, 43c of the piezoelectric element 43 are cleaned in the way as has been described above, only either of these adhesive surfaces may be made to be cleaned.

The individual embodiments that have been described heretofore are those which illustrate the examples of the driving apparatuses according to the invention. The driving apparatus according to the invention is not limited to these embodiments and hence, the driving apparatuses of the embodiments may be modified or the invention may be applied to other things without departing from the spirit and scope of the claims of the invention.

For example, while in the embodiments, the actuator is supported from the direction which intersects the direction of extension and contraction of the piezoelectric element at right angles and the end portion of the piezoelectric element is made to constitute the free end, as with the configuration which is illustrated in Japanese Patent No. 3141714, for example, a configuration may be adopted in which the end portion of the actuator is fixed to the main body. In this case, since the weight member does not have to be provided at the end portion of the piezoelectric element, the reduction in size of the unit can be realized.

In addition, the application of the driving apparatus according to the invention is not limited to the application in which the driving apparatus is used to move a focusing lens or a zoom lens, and the driving apparatus may be used for a photographic apparatus to move a CCD. It will be effective for the driving apparatus to be used for a mobile phone.

Additionally, while in the embodiment, the surface roughness of the adhesive surface is made rough by use of the 400-grit sand paper as the particularly preferred example, the surface roughness may be made rough by use of a sand paper having a larger grit number such as a 800-grit sand paper. In place of the use of sand papers, for example, sand blasting or shot blasting may be used. In this case, by use of abrasive grains (grains or powder with high hardness which exhibit the function as a grinding stone) whose grit is rougher than the grit of the 800-grit sand paper, at least an area whose surface roughness is Ra 1 μm or more can be provided on the adhesive surface.

EXAMPLES

Examples and comparison examples will be described hereinbelow.

Example 1

A surface of a piezoelectric element to which a driving member was to be connected was roughened by a 400-grit sand paper, and the roughened surface was cleaned with an alcohol based solvent, whereafter the piezoelectric element and the driving member were connected together by an adhesive so as to obtain a driving apparatus.

Comparison Example 1

A comparison example was prepared similarly to Example 1 except that a surface of a piezoelectric element to which a driving member was to be connected was not roughened.

(Continuous Drop Test)

Using the driving apparatus of Example 1 and Comparison Example 1, a continuous drop test was carried out, and their drop strengths were evaluated. In the continuous drop test, specifically speaking, the driving apparatuses were dropped 30 times continuously from a predetermined drop height, whereafter electric signals were inputted into the piezoelectric elements. Then, a case where the driving properties of movable lenses satisfied a predetermined criterion when the electric signals were so inputted was evaluated as ○, while a case where the driving properties of the movable lenses did not satisfy the predetermined criterion was evaluated as X.

As a result, as is shown in FIG. 8(A), with Example 1, all tests of 22 tests satisfied the criterion to provide a probability of 100%, whereas with Comparison Example 1, as is shown in FIG. 8(B), only one test of 6 tests satisfied the criterion to provide a probability of 13%. Furthermore, with Example 1, even in a case were a higher drop height was used so that a larger impact force was applied to the driving apparatus, the failure of the connecting portion between the piezoelectric element and the driving member was prevented, and it was possible to verify the advantage that a sufficient strength is secured.

Example 2

An end face of a piezoelectric element in the direction of extension and contraction thereof was roughened with a 400-grit sand paper, and the roughened end face was cleaned with an alcohol based solvent, whereafter a driving member which is 3.6 mm long was connected to the end face by an adhesive, so as to obtain Example 2.

Example 3

Example 3 was obtained in the similar fashion to Example 2 except that an end face of a piezoelectric element in the direction of extension and contraction thereof was roughened with a 800-grit sand paper.

Comparison Example 2

A comparison example was prepared similarly to Example 2 except that an end face of a piezoelectric element in the direction of extension and contraction thereof was not roughened.

(Adhesive Force Comparison Test)

Using driving apparatuses of Example 2, Example 3 and Comparison Example 2, an adhesive force comparison test was carried out, and their adhesive forces were evaluated. Note that the hardening condition of the adhesive was 65 minutes×2. In this adhesive force comparison test, specifically speaking, after piezoelectric elements were fixed, a force was applied respectively to driving members at distal ends thereof in a direction at right angles to the driving members by a force gauge to measure a breaking force when the driving members were broken.

As a result, as is shown in FIG. 9, with Example 2, a mean breaking force was 660 gf, a maximum breaking force was 760 gf, and a minimum breaking force was 600 gf, and with Example 3, a mean breaking force was 640 gf, a maximum breaking force was 760 gf, and a minimum breaking force was 530 gf. In contrast to this, with Comparison Example 2, a mean breaking force was 280 gf, a maximum breaking force was 350 gf, and a minimum breaking force was 160 gf. Consequently, it was possible to verify the advantage that the adhesive force is intensified by making rough the surface roughness of the surface where the driving member is bonded and connected to the piezoelectric member, so that the driving member and the piezoelectric member are integrated with each other strongly and rigidly.

Example 4

In Example 4 in which a driving member which was 3.6 mm long was connected to an end face of a piezoelectric element in the direction of extension and contraction thereof by an adhesive, a correlation between the adhesive force and driving speed properties of the driving member were evaluated by changing variously an adhesive force acting between the piezoelectric element and the driving member. Here, the adhesive force was made to be represented by a breaking force resulting when the piezoelectric element, which was fixed, was broken as a result of applying a force to a distal end of the driving member in a direction at right angles to the driving member by a force gauge. In addition, the driving speed properties were made to be represented by a driving speed V1 at which the driving member was caused to travel in a certain determined direction and a driving speed V2 at which the driving member was caused to travel in a reverse direction which was the opposite direction to the certain determined direction.

As a result, as is shown in FIG. 10, it was found that the driving speed V1 at which the driving member traveled in one direction and the driving speed V2 at which the driving member traveled in the other direction also increased remarkably as the adhesive force increased, and it was possible to verify the advantage that the driving speed is increased by intensifying the adhesive force.

According to the invention, by intensifying the adhesive force at the connecting portions, the failure of the connecting portions can be prevented so as to secure a sufficient strength, and in addition to this, the driving speed can be increased by integrating the relevant constituent parts by virtue of the adhesion by the adhesive, that is, the driving properties can be enhanced in this way.

The entire disclosure of each and every foreign patent application from which the benefit of foreign priority has been claimed in the present application is incorporated herein by reference, as if fully set forth.

What is claimed is:

1. A driving apparatus comprising:
   an electro-mechanical conversion element;
   a driving member, connected to an end side of the electro-mechanical conversion element by an adhesive, that moves in response to extension and contraction of the electro-mechanical conversion element;
   a driven member frictionally engaged with the driving member, so as to cause the driven member to travel along the driving member;
   a main body supporting the driving member for movement; and
   a weight member that is heavier than the driving member is connected to an end side of the electro-mechanical conversion element by an adhesive, the weight member being connected in such a state that the weight member is not supported or fixed to the main body of the driving apparatus,
   wherein a treatment for increasing adhesive force to greater than that before treatment is applied to an adhesive surface by a cleaning treatment or a mechanical treatment, the adhesive surface comprises an area whose surface roughness is Ra 1 μm or more which is to be attached to the adhesive, on at least one of the electro-mechanical conversion element and the weight member.

2. A driving apparatus as set forth in claim 1, wherein the mechanical treatment is a sanding process.

3. A driving apparatus as set forth in claim 2, wherein the sanding process is implemented by use of an abrasive grain which is coarser than the grit of an 800-grit sand paper.

4. A driving apparatus as set forth in claim 1, wherein the adhesive surface on at least one of the electro-mechanical conversion element and the driving member comprises an area whose surface roughness is between Ra 5 μm and Ra 6 μm.

5. A driving apparatus as set forth in claim 1, wherein the adhesive surface on at least one of the electro-mechanical conversion element and the driving member comprises an area whose surface roughness is rougher than surface roughnesses of other surfaces than the adhesive surface.

6. A driving apparatus as set forth in claim 1, wherein the weight member has a Young's modulus smaller than that of the electro-mechanical conversion element.

7. A driving apparatus as set forth in claim 1, wherein the weight member has a Young's modulus smaller than that of the driving member.

8. A driving apparatus as set forth in claim 1, wherein the weight member has a Young's modulus of 1 Gpa or less.

9. A driving apparatus as set forth in claim 1, wherein the weight member has a specific gravity of 1.8 or larger.

10. A driving apparatus as set forth in claim 1, wherein the weight member has a specific gravity larger than the specific gravity of the driving member.

11. A photographic apparatus comprising:
the driving apparatus set forth in claim 1; and
an optical member connected to the driven member of the driving apparatus.

12. A mobile phone comprising the driving apparatus set forth in claim 1.

13. A mobile phone comprising the photographic apparatus set forth in claim 11.

* * * * *